(12) United States Patent
Ma et al.

(10) Patent No.: US 11,417,735 B2
(45) Date of Patent: Aug. 16, 2022

(54) METHOD FOR FABRICATING SEMICONDUCTOR DEVICE

(71) Applicant: United Microelectronics Corp., Hsinchu (TW)

(72) Inventors: Zhuona Ma, Singapore (SG); Mengkai Zhu, Singapore (SG); Runshun Wang, Singapore (SG); Hua-Kuo Lee, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 377 days.

(21) Appl. No.: 16/831,850

(22) Filed: Mar. 27, 2020

(65) Prior Publication Data

US 2021/0305377 A1   Sep. 30, 2021

(51) Int. Cl.
*H01L 21/28* (2006.01)
*H01L 21/311* (2006.01)
*H01L 21/3213* (2006.01)

(52) U.S. Cl.
CPC .. *H01L 29/40114* (2019.08); *H01L 21/31116* (2013.01); *H01L 21/32135* (2013.01)

(58) Field of Classification Search
CPC ......... H01L 29/40114; H01L 27/11534; H01L 21/31116; H01L 21/32135; H01L 21/31053; H01L 21/31055; H01L 21/31056; H01L 29/42328; H01L 29/66825; H01L 21/3213; H01L 21/32139; H01L 27/11517; H01L 27/11521; H01L 27/11524; H01L 27/11526; H01L 27/11529; H01L 27/11531; G11C 16/0433
See application file for complete search history.

(56) References Cited

U.S. PATENT DOCUMENTS

| | | | |
|---|---|---|---|
| 9,443,946 B2 | 9/2016 | Zhang et al. | |
| 2016/0225776 A1* | 8/2016 | Chuang | H01L 21/32115 |
| 2016/0307911 A1* | 10/2016 | Wu | H01L 27/11548 |
| 2018/0151581 A1* | 5/2018 | Wu | H01L 27/11543 |
| 2018/0240798 A1* | 8/2018 | Yang | H01L 27/11546 |
| 2020/0227426 A1* | 7/2020 | Chuang | H01L 21/0332 |
| 2020/0303394 A1* | 9/2020 | Hung | H01L 27/11573 |
| 2021/0005725 A1* | 1/2021 | Xing | H01L 21/02244 |
| 2021/0249429 A1* | 8/2021 | Liu | H01L 27/11548 |

* cited by examiner

*Primary Examiner* — Nilufa Rahim
(74) *Attorney, Agent, or Firm* — J.C. Patents

(57) ABSTRACT

A method for fabricating a semiconductor device is provided. The method includes providing a substrate, having a cell region and a logic region and including a first conductive layer as a top layer, wherein shallow trench isolation (STI) structures are disposed in the substrate at cell region and the logic region. A first dry etching process is performed to preliminarily etch the first conductive layer and the STI structures at the cell region. A wet etching process is performed over the substrate to etch the STI structures down to a preserved height. A control gate stack is formed on the first conductive layer at the cell region. A second dry etching process is performed on a portion of the first conductive layer to form a floating gate under the control gate stack at the cell region and remove the first conductive layer at the logic region.

16 Claims, 9 Drawing Sheets

METHOD FOR FABRICATING SEMICONDUCTOR DEVICE

BACKGROUND OF THE INVENTION

Field of the Invention

The invention relates to a semiconductor fabrication technology, in particular, to a method for fabricating a semiconductor device.

Description of Related Art

An integrated circuit apparatus usually includes various circuits to perform various functions as designed. In an example, aa integrated circuit may include memory part for storing data and the peripheral circuit including core circuit to control the access to the memory part and may also including other circuits in operation with the memory part.

The integrated circuit as fabricated by semiconductor technology usually is fabricate din the same substrate. The substrate is configured to at least have a cell region and a logic region. Various devices, such as transistors with the interconnection structure, are respectively fabricated at the cell region and the logic region. Since the device loading at the cell region and the logic region, the fabrication processes at the cell region and the logic region are not at the identical condition. Some defects may be induced at the cell region and the logic region.

The defects in an example may include the pitting defects and nodule defects. The pitting defects may be referring to the occurrence of pits, penetrating the gate insulating layer and reaching to the substrate. The nodule defects may be referring to the dielectric residue, such as oxide nodules, on the working surface of the substrate.

The mechanisms to reduce the pitting defects and the nodule defect may be not clearly independent. Usually, the intension to reduce the nodule defects may cause more pitting defects and the intension to reduce the pitting defects may cause more nodule defects.

How to reduce both the pitting defects and the nodule defects is still one the issues in the art for developing the fabrication technology.

SUMMARY OF THE INVENTION

The invention provides a method for fabricating a semiconductor device.

The pitting defects and the nodule defects may be reduced.

In an embodiment, the invention provides a method for fabricating a semiconductor device. The method includes providing a substrate, having a cell region and a logic region and including a first conductive layer as a top layer, wherein shallow trench isolation (STI) structures are disposed in the substrate at cell region and the logic region. A first dry etching process is performed to preliminarily etch the first conductive layer and the STI structures at the cell region. A wet etching process is performed over the substrate to etch the STI structures down to a preserved height. A control gate stack is formed on the first conductive layer at the cell region. A second dry etching process is performed on a portion of the first conductive layer to form a floating gate under the control gate stack at the cell region and remove the first conductive layer at the logic region.

In an embodiment, as to the method for fabricating the semiconductor device, the second dry etching process includes a first stage to clean a top surface of the first conductive layer; and a second stage to etch the first conductive layer.

In an embodiment, as to the method for fabricating the semiconductor device, the first stage of the second dry etching process uses a first etchant with a substantially-equal etching selectivity to polysilicon and oxide, so that at least a fabrication residue at a top surface of the first conductive layer is removed to expose the first conductive layer as a cleaned surface.

In an embodiment, as to the method for fabricating the semiconductor device, the fabrication residue comprises a native oxide on the first conductive layer, wherein the first conductive layer is polysilicon.

In an embodiment, as to the method for fabricating the semiconductor device, the second stage of the second dry etching process uses a second etchant with an etching selectivity substantially to polysilicon relatively to oxide.

In an embodiment, as to the method for fabricating the semiconductor device, the first conductive layer is a polysilicon layer, wherein the substrate comprises: a semiconductor substrate; an insulating layer on the semiconductor substrate; and the first conductive layer on the insulating layer.

In an embodiment, as to the method for fabricating the semiconductor device, the control gate stack as formed comprises: an insulating layer on the first conductive layer; a second conductive layer, serving as a control gate, disposed on the insulating layer; a mask layer on the second conductive layer; and a spacer, disposed on a sidewall of the second conductive layer and the mask layer, in connection to the insulating layer.

In an embodiment, as to the method for fabricating the semiconductor device, the insulating layer and the spacer are oxide/nitride/oxide (ONO) stack.

In an embodiment, as to the method for fabricating the semiconductor device, an averaged thickness of the first conductive layer at the logic region is substantially larger than an averaged thickness of the first conductive layer at the cell region before forming the control gate stack.

In an embodiment, as to the method for fabricating the semiconductor device, the first dry etching process to preliminarily etch the first conductive layer and the STI structures at the cell region comprises: forming an etching mask layer to cover the logic region; performing an etching back process on the first conductive layer and the STI structures at the cell region; and removing the etching mask layer. The first conductive layer and the STI structures in the cell region are at a predetermined height.

In an embodiment, as to the method for fabricating the semiconductor device, the wet etching process at the cell region and the logic region has an etching selectivity on oxide with respect to polysilicon, so as to have a height of the STI structure at the cell region, wherein the height of the STI structure after the wet etching process is lower than a height of the first conductive layer but remains contacting the first conductive layer.

In an embodiment, as to the method for fabricating the semiconductor device, the method further comprises forming a logic gate structure on the substrate at the logic region after second dry etching process to form the floating gate.

In an embodiment, as to the method for fabricating the semiconductor device, an isolation structure between the cell region and the logic region comprises one of the STI structures with a size larger than a size of the STI structures in the cell region and the logic region.

In an embodiment, as to the method for fabricating the semiconductor device, the first conductive layer comprises a first region between adjacent two of the STI structures at the logic region larger in size than a second region between adjacent two of the STI structures at the cell region.

In an embodiment, as to the method for fabricating the semiconductor device, as to the first conductive layer, a first indent depth at the first region is larger than a second indent depth at the second region.

In an embodiment, as to the method for fabricating the semiconductor device, after performing the second dry etching process, an insulting layer comprised in the substrate and under the first conductive layer is exposed.

In order to make the aforementioned and other objectives and advantages of the present invention comprehensible, embodiments accompanied with figures are described in detail below.

DESCRIPTION OF THE EMBODIMENTS

The invention provides a semiconductor device, which is b=fabricate don a substrate. The substrate in an example may be configured to have a cell region and a logic region. The semiconductor device includes a memory device in the cell region and the application circuit in the logic region.

In fabrication, memory cells and the logic devices are respectively formed at the cell region and the logic region. The memory cell in an example is a flash memory cell, including floating gate and control gate, which are isolated by insulating layer, such as oxide/nitride/oxide (ONO) layer.

Usually, the control gate with the spacer is formed on the polysilicon layer, which is to be formed as the floating gate later. Then, the polysilicon layer is patterned by etching the portion not covered by the control gate until the gate insulating layer is exposed. As a result, the floating gate from polysilicon layer is formed.

The polysilicon layer relatively is rather thin and is distributed on both cell region and the logic region, between the STI structures. The polysilicon layer needs to be removed to expose the insulating layer on the substrate.

Some issues have been looked into in the invention Since the thickness of the polysilicon layer is rather small, the etching process on the polysilicon layer may cause pitting defect at the logic region. In addition, the fabrication residue, such as native oxide, may exit on the top surface of the polysilicon layer (floating gate). Some material residues may stand on the insulating layer after the etching process on the polysilicon layer to form the floating gate. This is referred as the nodule defects, which are more easily occurring at the cell region. Both the nodule defects and the pitting defects are still intended to be effectively reduced.

The invention provides multiple embodiments for descriptions but the invention is not just limited to the embodiments as provided. In addition, a combination may also made between the embodiments without being specifically limited to the embodiments.

Figure 1:
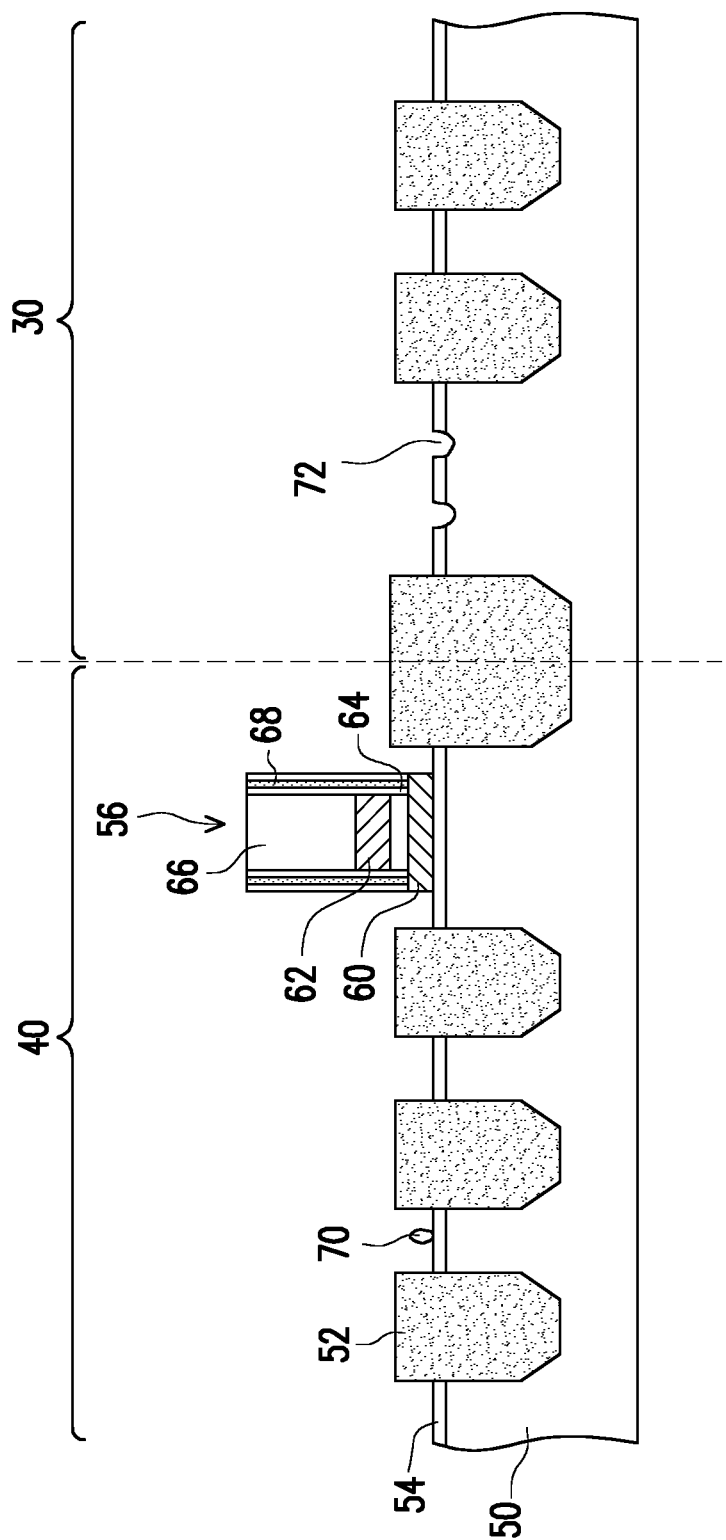
FIG. 1 is a drawing, schematically illustrating a structure of semiconductor device as looked into, according to an embodiment of the invention.

FIG. 1 is a drawing, schematically illustrating a structure of semiconductor device as looked into, according to an embodiment of the invention. Referring to FIG. 1, to reduce the device defects, the invention has looked into the pitting defects 72 and the nodule defects 70 in the semiconductor device in fabrication.

The substrate 50 is configured to at least have a cell region 40 and a logic region 30. The semiconductor device involves the memory cells 56 formed over the substrate 50 at cell region 40 while the logic devices in the logic region 30 may be formed later. The logic devices as usually known would include various transistor devices for forming an operation circuit in association with the memory cells in the cell region 30.

A plurality of shallow trench isolation (STI) structures 52 may be formed in the substrate 50 to define active regions in the substrate 50. A larger STI structure may also formed between the cell region 40 and a logic region 30.

An insulating layer 54 may also formed on the substrate 50. Functionally, a portion of the insulating layer 54 may provide as a gate insulating layer for the memory gate structure 56, generally. The memory gate structure 56 in wan embodiment includes a floating gate 60, a control gate 62 and a tunnel layer 64 between the floating gate 60 and the control gate 62. The memory gate structure 56 may further include a mask layer 66 on the control gate 62 and the spacer 68 at least at a sidewall of the control gate 62 with the mask layer 66 and then in connecting to the tunnel layer 64.

As looked into in the invention, the floating gate 60 usually is formed by patterning a preliminary polysilicon layer on the insulating layer 54, in which the preliminary polysilicon layer is etched while the memory gate structure 56 is used as the etching mask.

As noted, the source/drain regions may be also formed in the substrate but the invention is not limited to the formation of the source/drain regions. The descriptions about source/drain regions are omitted here and can be known the in ordinary art without specific limitations.

The nodule defects 70 in an example as observed in the invention include an oxide residue in an example during fabrication while the preliminary polysilicon layer is etched to form the floating gate 60. The oxide residue may even exit in the preliminary polysilicon layer and not etched while the polysilicon is etched with the etching selectivity.

As to the logic region, the device loading in the logic region may be less than the device loading of the memory cells in the cell region 40. In this situation, a larger area between STI structures may exist in the logic region 30. During the fabrication process, an indent of the preliminary polysilicon layer as to be etched to form the floating gate 60 may occur. The indent implies that the thickness is less than the thickness at the other peripheral region. When the polysilicon material for the floating gate 60 in the cell region 40 is etched, the indent of the preliminary poly silicon in the logic region has no sufficient thickness. Then, the etching process to etch polysilicon in the logic region 30 may penetrate the insulating layer 54, causing the pitting defects 72.

The invention has observed that the nodule defects 70 and the pitting defects 72 are coexisting. When the nodule defects 70 as the oxide residue is more intended to be removed in better condition, the insulating layer 54 in the logic region may be easily penetrated to form the pitting defects 72. In the opposite way, if the pitting defect 72 is intended to be reduced by use of high etching selectivity to the polysilicon, the nodule defects would get more serious because the oxide is not etched.

The nodule defects are generally existing over the whole substrate but cell region 40 may occur more. Likewise, the pitting defects may occur more in the logic region 30. However, the invention is not just limited to the embodiments as described.

To reduce both the nodule defects 70 and the pitting defects 72 after looking into the mechanism causing the defects, the invention has provided a fabrication method to reduce both nodule defects 70 and the pitting defects 72 in a better manner.

FIG. 2A to FIG. 2H are drawings, schematically illustrating a process flow for fabricating a semiconductor device, according to further an embodiment of the invention.

Figure 2A:
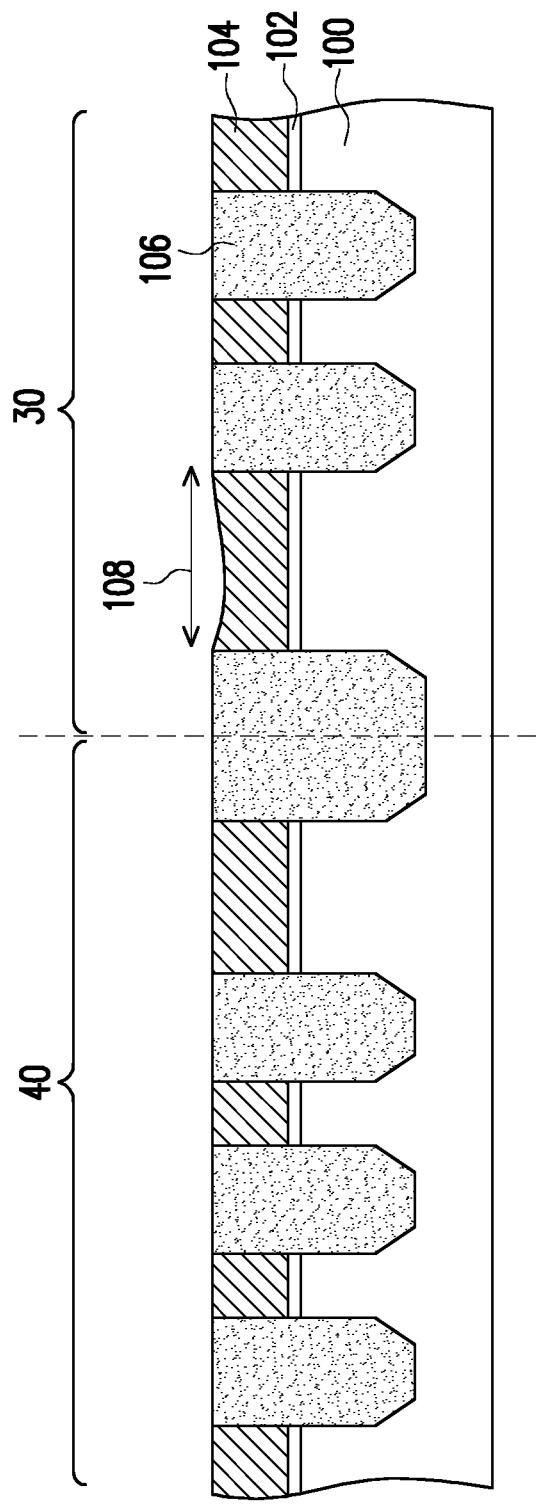
FIG. 2A to FIG. 2H are drawings, schematically illustrating a process flow for fabricating a semiconductor device, according to further an embodiment of the invention.

Referring to FIG. 2A, a substrate 100 is provided, in which the substrate 100 has be configured to at least have a cell region 40 and the logic region 30. An insulating layer 102 is formed on the substrate 100, and a polysilicon layer 104 is formed on the insulating layer 102. As noted, the polysilicon layer 104 is preliminary formed here but is to be formed later into the floating gate in the cell region 40. Also noted, the polysilicon layer 104 as used here is an embodiment for description. The polysilicon layer 104 may be referred as a conductive layer.

A plurality of STI structures 106 are formed in the polysilicon layer 104, the insulating layer 102 and the substrate 100. As noted, the device loading of logic devices in the logic region 30 is usually less than the device loading of memory cells in the cell region 40. In this situation, certain areas 108 being relatively large in size may exist between the STI structures 106. Due to the large area, it may get indent, such as a dishing effect, when a polishing process is applied over the substrate to form the STI structures. If the indent of the polysilicon layer 104 with over-reduced thickness at the area 108, it would potentially cause the pitting defects later as stated in FIG. 1. The invention has looked into the pitting defects in associating with the nodule defects and provides a fabrication procedure. In the preliminary state, the polysilicon layer has a thickness in an example is 950 Angstroms(Å) while the area 108 has a thickness of 735 Å at the indent part in an example after polishing process.

Figure 2B:
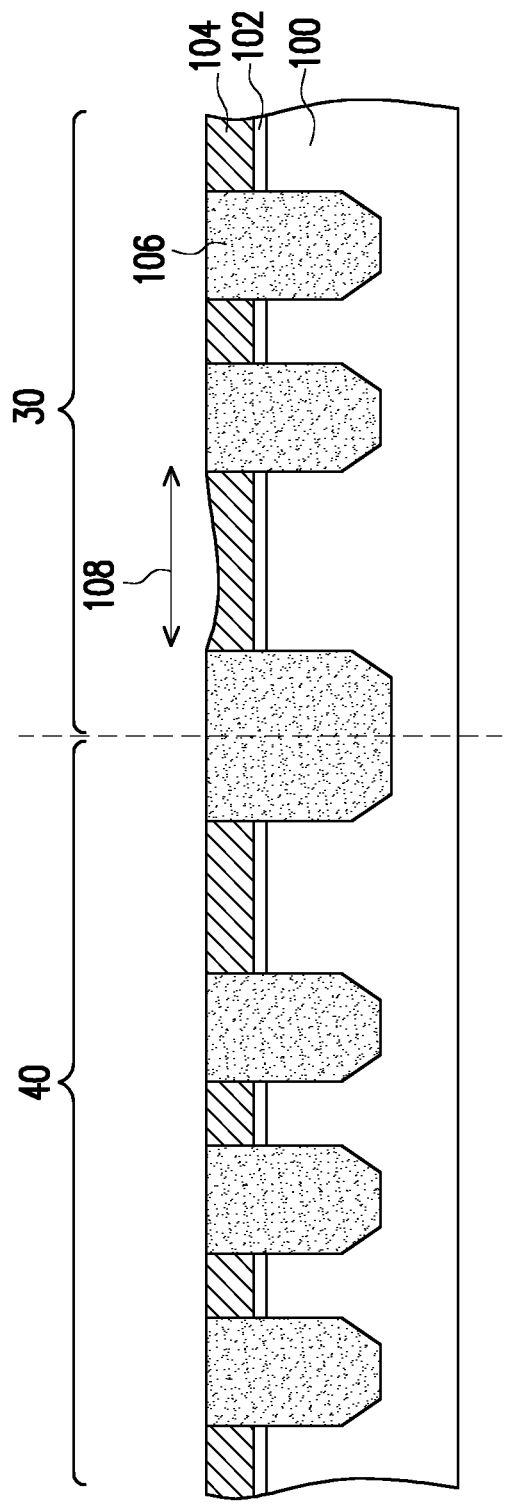

Referring to FIG. 2B, the current thickness of the polysilicon layer 104 is larger than the actual thickness as needed for the floating gate. Some etching processes would be needed to reduce the thickness of the polysilicon layer 104, in which the height of the STI structures 106 are also necessary to be accordingly reduced. An etching back process is performed to preliminarily reduce the thickness of the polysilicon layer 104, in which the etching process substantially has no etching selectivity to the polysilicon material for the polysilicon layer 104 and the oxide material for the STI structure 106. The etching back process in an embodiment is a dry etching in an embodiment. In an embodiment, the polysilicon layer has a thickness in an example is 650 Å while the area 108 has a thickness of 435 Å.

Figure 2C:
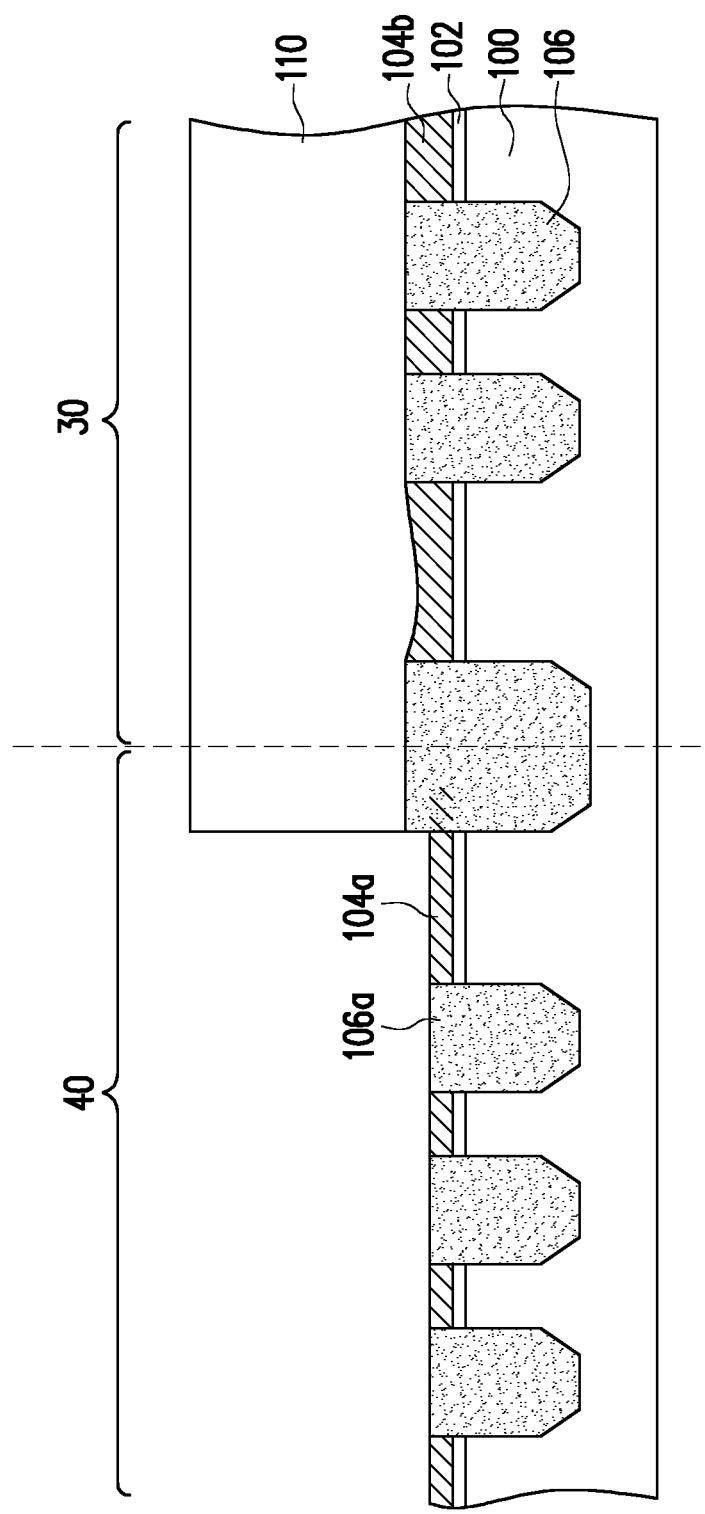

In FIG. 2C, a photoresist layer 110 may be formed over the substrate 100 to cover in the logic region. The cell region is exposed. Then, another etching back process such as dry etching process may be performed at the cell region 40, in which the logic region 30 is covered by the photoresist layer 110, serving as an etching mask, and is not etched. As a result, the thickness of the polysilicon layer 104 at the logic region 30 is reserved large. The thickness of the polysilicon layer 104 at the cell region 40 in an embodiment is referred to the polysilicon layer 104a with the preserved thickness as expected for the floating gate later in an embodiment. However, the preserved thickness of the polysilicon layer 104a is not limited to the floating gate. The polysilicon layer 104 at the cell region 30 in an embodiment is referred to the polysilicon layer 104b, having the reserved thickness relatively larger than the polysilicon layer 104a. As to be described later, this thickness of the polysilicon layer 104b would reduce the occurrence of pitting defects. In an embodiment, the polysilicon layer 104a in the cell region 40 has a thickness of 390 Å in an example. The thickness of 390 Å in an embodiment is set for the floating gate as to be formed later.

Figure 2D:
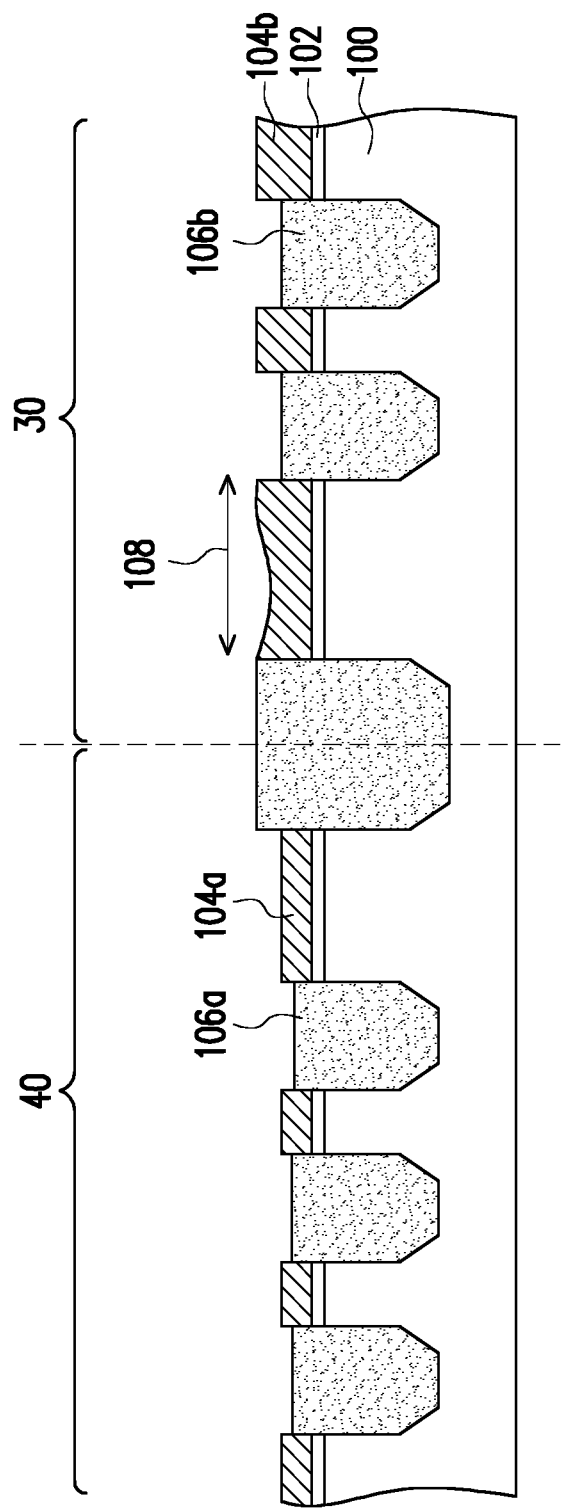

Referring to FIG. 2D, the photoresist layer 110 is removed, and then a we etching process is performed over the substrate. The wet etching process has higher etching selectivity to oxide, so that the STI structures 106 is reduced to a height as preserved, in which the STI structures 106 in the cell region 40 are referred to the STI structures 106a and the STI structures 106 in the logic region 30 are referred to the STI structures 106b. The polysilicon layer 104a at the cell region 40 and the polysilicon layer 104b at the logic region 30 are substantially not etched and are higher than the STI structures 106a, 106b. However, the STI structures 106a, 106b still protrude and contact the polysilicon layers 104a, 104b.

Figure 2E:
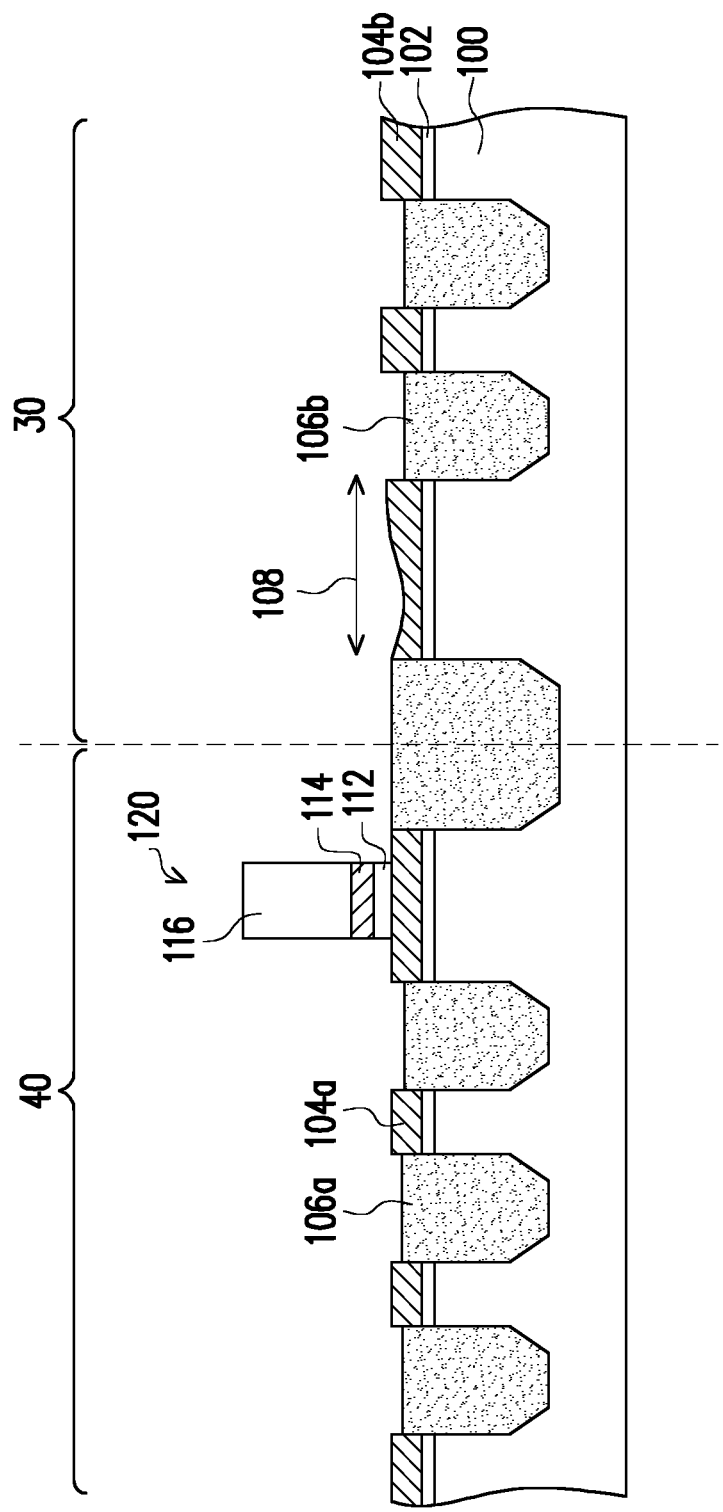

Referring to FIG. 2E, a tunnel layer 112, a control gate 114 and a mask layer 116 as a part of a memory gate structure 120 are formed on the polysilicon layer 104a in the cell region 40. The tunnel layer 112 may be oxide layer or ONO layer without specific limitation. The control gate 114 is a conductive layer and may be the polysilicon layer in an embodiment. As noted, the memory gate structure 120 is preliminary formed but not complete yet. In fabrication, the tunnel layer 112, the control gate 114 and the mask layer 116 may be formed by first depositing preliminary layers with the stack sequence, and then the patterning process is performed on the preliminary stack layer, to form the tunnel layer 112, the control gate 114 and the mask layer 116. The invention does not limit to a specific manner to form the tunnel layer 112, the control gate 114 and the mask layer 116. After the process in FIG. 2E, in an embodiment, the thickness of the polysilicon layer 104a is about 310 which the thickness of the polysilicon layer 104b at the area 108 is about 320 Å. As noted, the other portion of the polysilicon layer 104b may be not uniform but still larger than the thickness 320 at the area 108. The invention is not limited to the specific thickness. The pitting defects may occur at the area 108 with higher probability as concerned.

Figure 2F:
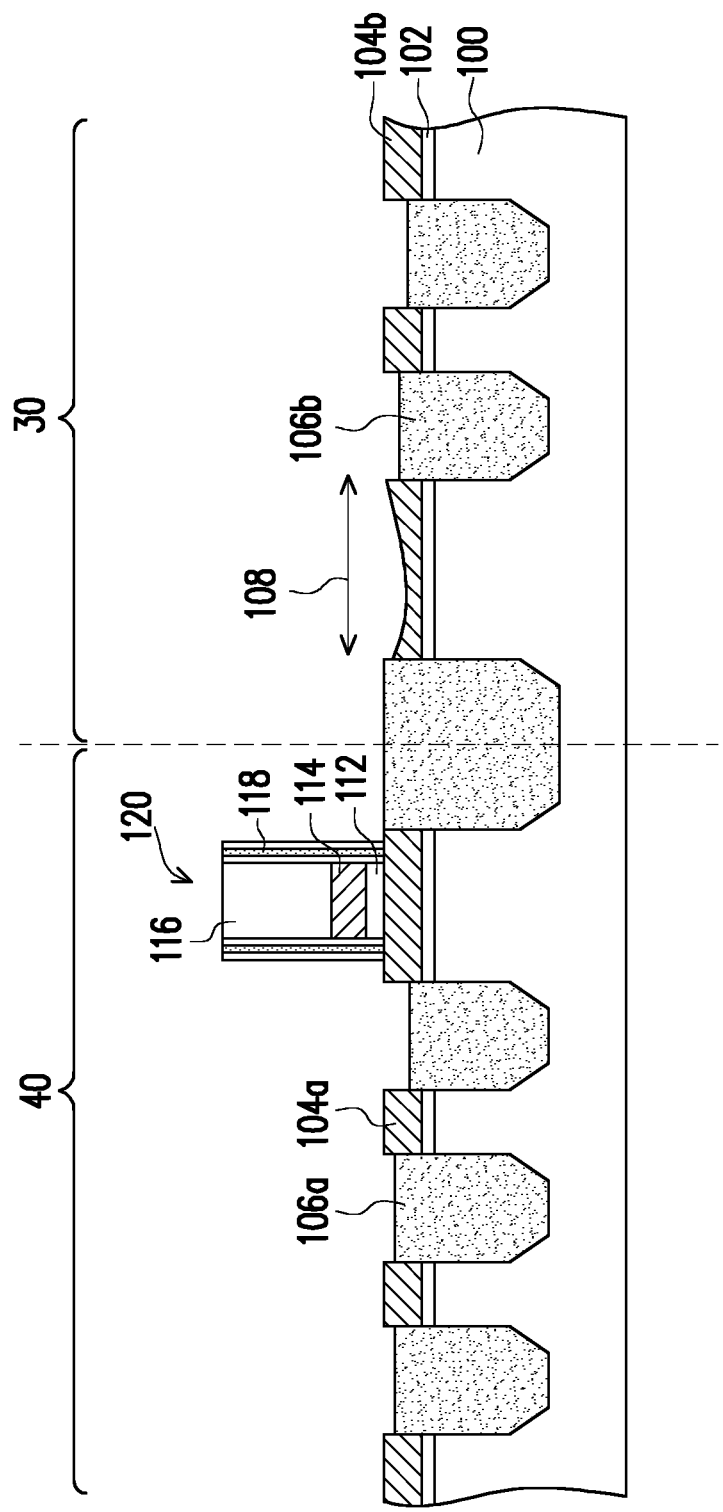

Referring to FIG. 2F, a spacer 118 is formed on sidewalls of the stack structure of the tunnel layer 112, the control gate 114 and the mask layer 116. The spacer 118 in an embodiment is ONO layer but the invention is not limited to. The process to form the spacer 118, the tunnel layer 112, the control gate 114 and the mask layer 116 may be not necessary to be limited to a specific manner. The memory gate structure 120 at the current stage is basically formed except the floating gate. The thickness of the polysilicon layer 104a, 104b are further reduced except the portion under the mask layer 116 as reserved for floating gate remain 390 Å. In an embodiment, the thickness of the polysilicon layer 104b at the area 108 is about 290 Å while the polysilicon layer 104a is about 280 Å, about equal to the thickness 290A at the area 108. Since the thickness of the polysilicon layer 104b in the area 108 has been reserved in FIG. 2C, the thickness of the in the area 108 is not over reduced relative to the polysilicon layer 104a in the cell region. As noted, the thicknesses with the numerical values are just to show the thickness relation, in which the schematically drawing does not reflect the change in actual scale.

Figure 2G:
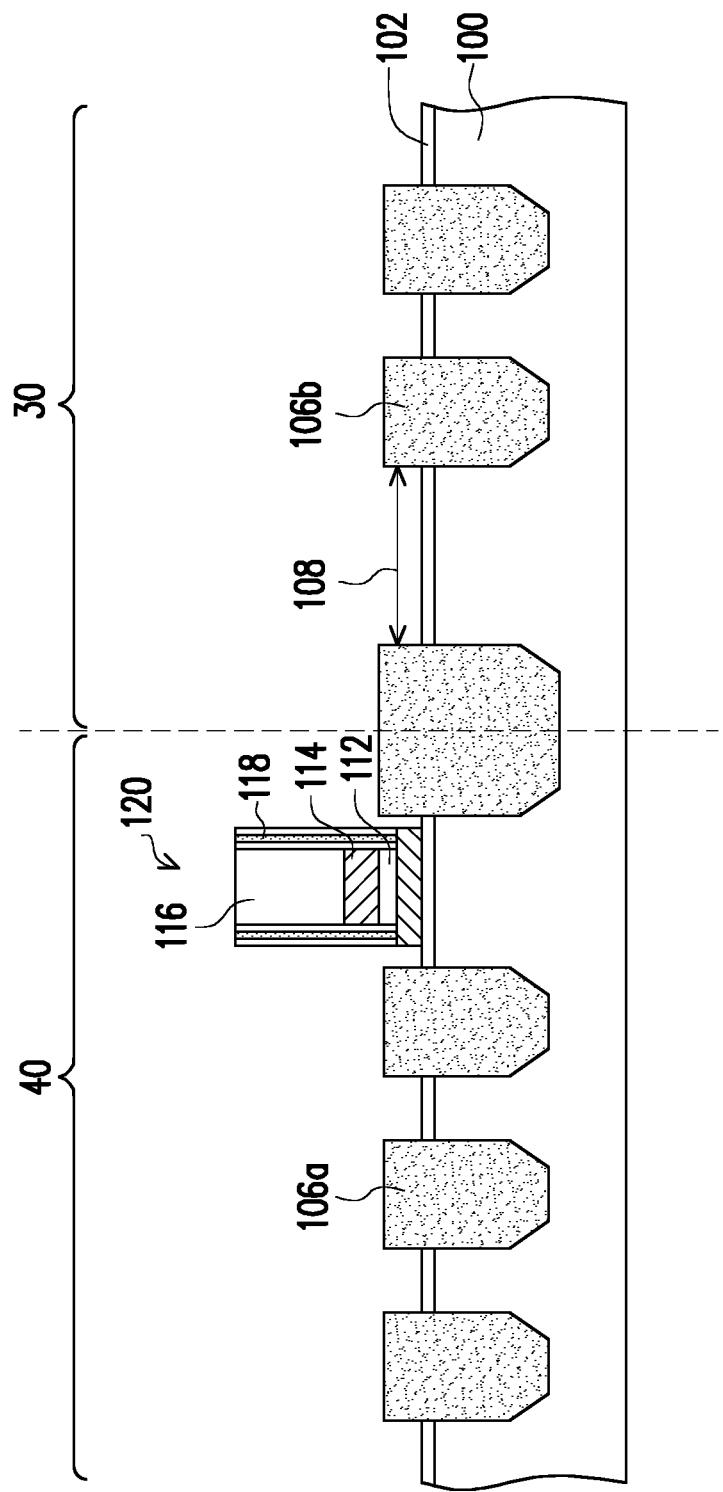

Referring to FIG. 2G, the floating gate is to be formed, in which the mask layer 116 with the spacer 118 may serve as an etch mask and another etching process, such as dry etching process, is performed to etch the polysilicon layer 104a in the cell region 40 and the polysilicon layer 104b in the logic region.

As noted, the dry etching process may involve a first stage and a second stage with the different etchants. The first stage is to clean a top surface of the first conductive layer, in which the oxide residue may exist on the polysilicon layer 104a, 104b. The etchant without etching selectivity in an embodiment may be used in the first stage to generally clean the polysilicon surface. In this stage, since the area 108 has sufficient polysilicon thickness for at least protecting the insulating layer 102. Then, the second stage uses another etchant with high etching selectivity to polysilicon. As a result, the second stage etches the polysilicon layer 104a, 104b with the mask layer 116. A portion of the polysilicon layer 104a under the mask layer 116 forms the floating gate and then the memory gate 120 is formed.

In the procedure above, the nodule defects 70 in FIG. 1 may be reduced, due to the two-stage etching process in FIG. 2G, in which the first stage may effectively clean the polysilicon surface while the area 108 still has sufficient thickness for protection the insulating layer. The second stage with etching selectivity to polysilicon may stop on the insulating layer 102. The nodule defects 70 in FIG. 1 may be effectively reduced.

As to the pitting defect 72 likely occurring in the logic region 30 at the area 108 as stated in FIG. 1 may also be reduced. The mechanism includes the factor in FIG. 2C, which reserves more thickness for the polysilicon layer 104b, resulting in the reserved thickness at the area 108 as shown in FIG. 2G. Then, when the etching process in FIG. 2G is performed, the polysilicon layer 104b at the area 108 during the first etching stage may have sufficient thickness to resist the occurrence of pitting defects. Since the thickness at the area 108 is sufficient, the first etching stage may efficiently clean the residue to reduce the nodule defects without much taking care on the area 108 about pitting defects. As a result, after the second etching stage, both the nodule defects and the pitting defects as stated in FIG. 1 may be effectively reduced. The production yield may be improved.

Figure 2H:
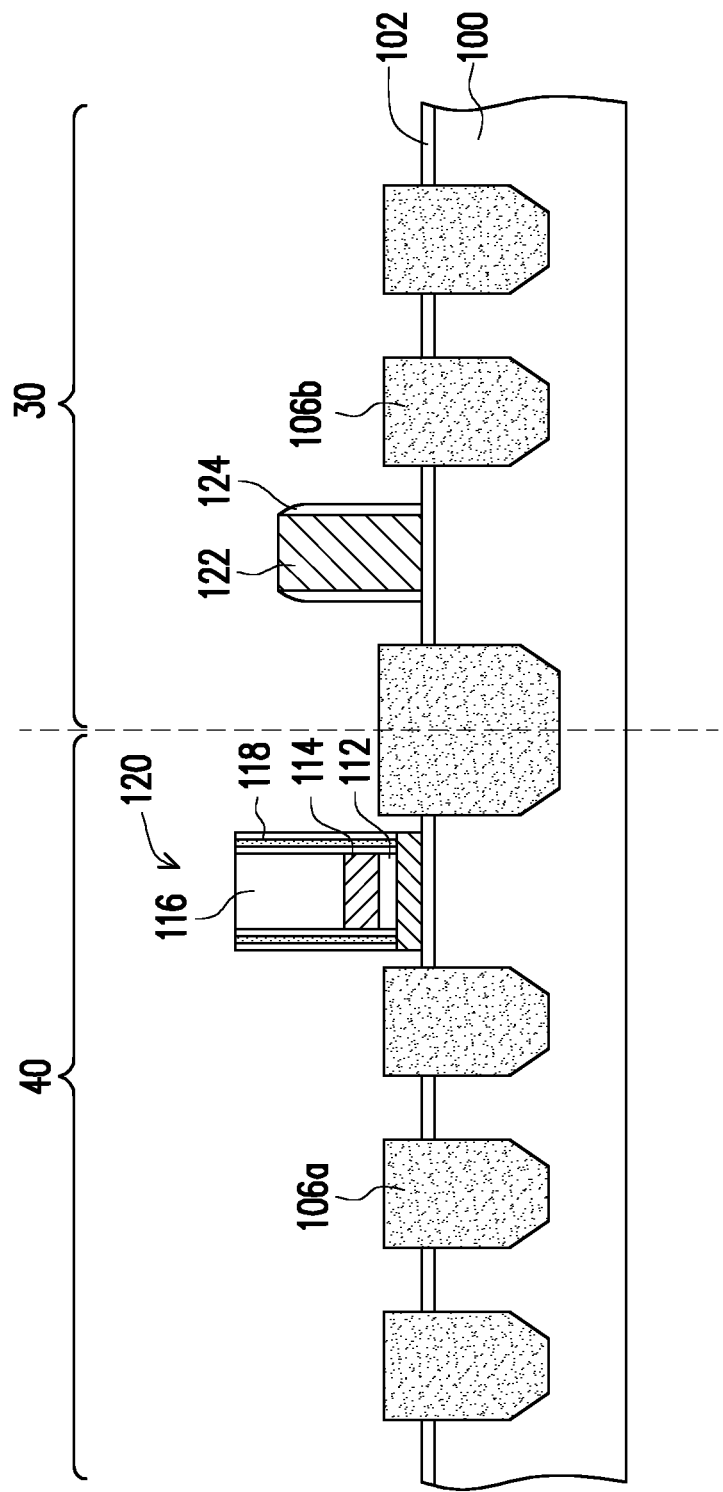

Referring to FIG. 2H, the subsequent process may form the logic gate 122 of the logic device on the insulating layer 102 at the logic region. A spacer 124 may also be formed on the sidewall of the logic gate 122. The invention is not just limited to the formation of the logic gate 122 in the subsequent processes.

As noted, the process in FIG. 2C and FIG. 2G may reach a balance effect.

FIG. 2C reserves more polysilicon thickness then the thickness at the area 108 may remain more. In this situation, the etching process in FIG. 2G may take two etching stages on the polysilicon layer with reduced nodule defects while the reserved polysilicon thickness at the area 108 in the logic region 30 with protection on the insulating layer 102 may effectively resist the occurrence of pitting defects.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:
1. A method for fabricating a semiconductor device, comprising:
 providing a substrate, having a cell region and a logic region and including a first conductive layer as a top layer, wherein shallow trench isolation (STI) structures are disposed in the substrate at cell region and the logic region;
 performing a first dry etching process to preliminarily etch the first conductive layer and the STI structures at the cell region;
 performing a wet etching process over the substrate to etch the STI structures down to a preserved height;
 forming a control gate stack on the first conductive layer at the cell region; and
 performing a second dry etching process on a portion of the first conductive layer to form a floating gate under the control gate stack at the cell region and remove the first conductive layer at the logic region.

2. The method of claim 1, wherein the second dry etching process comprises:
 a first stage to clean a top surface of the first conductive layer; and
 a second stage to etch the first conductive layer.

3. The method of claim 2, wherein the first stage of the second dry etching process uses a first etchant with a substantially-equal etching selectivity to polysilicon and oxide, so that at least a fabrication residue at a top surface of the first conductive layer is removed to expose the first conductive layer as a cleaned surface.

4. The method of claim 3, wherein the fabrication residue comprises a native oxide on the first conductive layer, wherein the first conductive layer is polysilicon.

5. The method of claim 3, wherein the second stage of the second dry etching process uses a second etchant with an etching selectivity substantially to polysilicon relatively to oxide.

6. The method of claim 1, wherein the first conductive layer is a polysilicon layer, wherein the substrate comprises:
 a semiconductor substrate;
 an insulating layer on the semiconductor substrate; and
 the first conductive layer on the insulating layer.

7. The method of claim 1, wherein the control gate stack as formed comprises:
 an insulating layer on the first conductive layer;
 a second conductive layer, serving as a control gate, disposed on the insulating layer;
 a mask layer on the second conductive layer; and
 a spacer, disposed on a sidewall of the second conductive layer and the mask layer, in connection to the insulating layer.

8. The method of claim 7, wherein the insulating layer and the spacer are oxide/nitride/oxide (ONO) stack.

9. The method of claim 1, wherein an averaged thickness of the first conductive layer at the logic region is substantially larger than an averaged thickness of the first conductive layer at the cell region before forming the control gate stack.

10. The method of claim 1, wherein the first dry etching process to preliminarily etch the first conductive layer and the STI structures at the cell region comprises:
 forming an etching mask layer to cover the logic region;
 performing an etching back process on the first conductive layer and the STI structures at the cell region; and
 removing the etching mask layer,
 wherein the first conductive layer and the STI structures in the cell region are at a predetermined height.

11. The method of claim 1, wherein the wet etching process at the cell region and the logic region has an etching selectivity on oxide with respect to polysilicon, so as to have a height of the STI structure at the cell region, wherein the height of the STI structure after the wet etching process is lower than a height of the first conductive layer but remains contacting the first conductive layer.

12. The method of claim 1, further comprising forming a logic gate structure on the substrate at the logic region after second dry etching process to form the floating gate.

13. The method of claim 1, wherein an isolation structure between the cell region and the logic region comprises one of the STI structures with a size larger than a size of the STI structures in the cell region and the logic region.

14. The method of claim 1, wherein the first conductive layer comprises a first region between adjacent two of the STI structures at the logic region larger in size than a second region between adjacent two of the STI structures at the cell region.

15. The method of claim 14, wherein, as to the first conductive layer, a first indent depth at the first region is larger than a second indent depth at the second region.

16. The method of claim 1, wherein after performing the second dry etching process, an insulting layer comprised in the substrate and under the first conductive layer is exposed.

* * * * *